United States Patent
Lin

(10) Patent No.: US 8,643,529 B2
(45) Date of Patent: Feb. 4, 2014

(54) SAR ASSISTED PIPELINED ADC AND METHOD FOR OPERATING THE SAME

(75) Inventor: Jin-Fu Lin, Tainan (TW)

(73) Assignee: Himax Technologies Limited, Tainan (TW)

( * ) Notice: Subject to any disclaimer, the term of this patent is extended or adjusted under 35 U.S.C. 154(b) by 0 days.

(21) Appl. No.: 13/488,544

(22) Filed: Jun. 5, 2012

(65) Prior Publication Data

US 2013/0321184 A1 Dec. 5, 2013

(51) Int. Cl.
*H03M 1/12* (2006.01)

(52) U.S. Cl.
USPC ........... 341/172; 341/118; 341/120; 341/143; 341/155; 341/161

(58) Field of Classification Search
USPC .................. 341/118, 120, 155, 161, 162, 172
See application file for complete search history.

(56) References Cited

U.S. PATENT DOCUMENTS

| | | | |
|---|---|---|---|
| 6,195,032 B1 * | 2/2001 | Watson et al. ................ | 341/162 |
| 7,071,863 B1 * | 7/2006 | Sutardja et al. ............... | 341/161 |
| 7,429,946 B2 * | 9/2008 | Huang .......................... | 341/172 |
| 7,486,216 B2 * | 2/2009 | Lee et al. ...................... | 341/161 |
| 7,705,764 B2 * | 4/2010 | Lee et al. ...................... | 341/172 |
| 7,978,117 B2 * | 7/2011 | Jeon et al. ..................... | 341/163 |
| 8,018,370 B2 * | 9/2011 | Thomas et al. ............... | 341/162 |
| 8,436,760 B1 * | 5/2013 | Hatanaka et al. ............. | 341/161 |
| 2005/0078026 A1 * | 4/2005 | Cai ................................ | 341/162 |
| 2005/0219111 A1 * | 10/2005 | Kobayashi et al. ........... | 341/172 |
| 2008/0129575 A1 * | 6/2008 | Huang .......................... | 341/172 |
| 2010/0066581 A1 * | 3/2010 | Ito ................................ | 341/158 |

* cited by examiner

*Primary Examiner* — Linh Nguyen
(74) *Attorney, Agent, or Firm* — McClure, Qualey & Rodack, LLP

(57) ABSTRACT

A method for operating a SAR assisted pipelined ADC includes enabling a SAR ADC in a current stage circuit for converting an input analog voltage into a digital code during a first time interval, resetting an operational amplifier of an MDAC in the current stage circuit during the first time interval, maintaining the SAR ADC of the current stage circuit in an enabled state for outputting during a second time interval, and enabling the MDAC in the current stage circuit during the second time interval. The method also includes enabling the SAR ADC in the current stage circuit for sampling during a third time interval and connecting the output terminal of the MDAC in the current stage circuit to the input terminal of the next stage circuit during the third time interval. The first, second, and third time intervals are continuous and do not overlap each other.

5 Claims, 5 Drawing Sheets

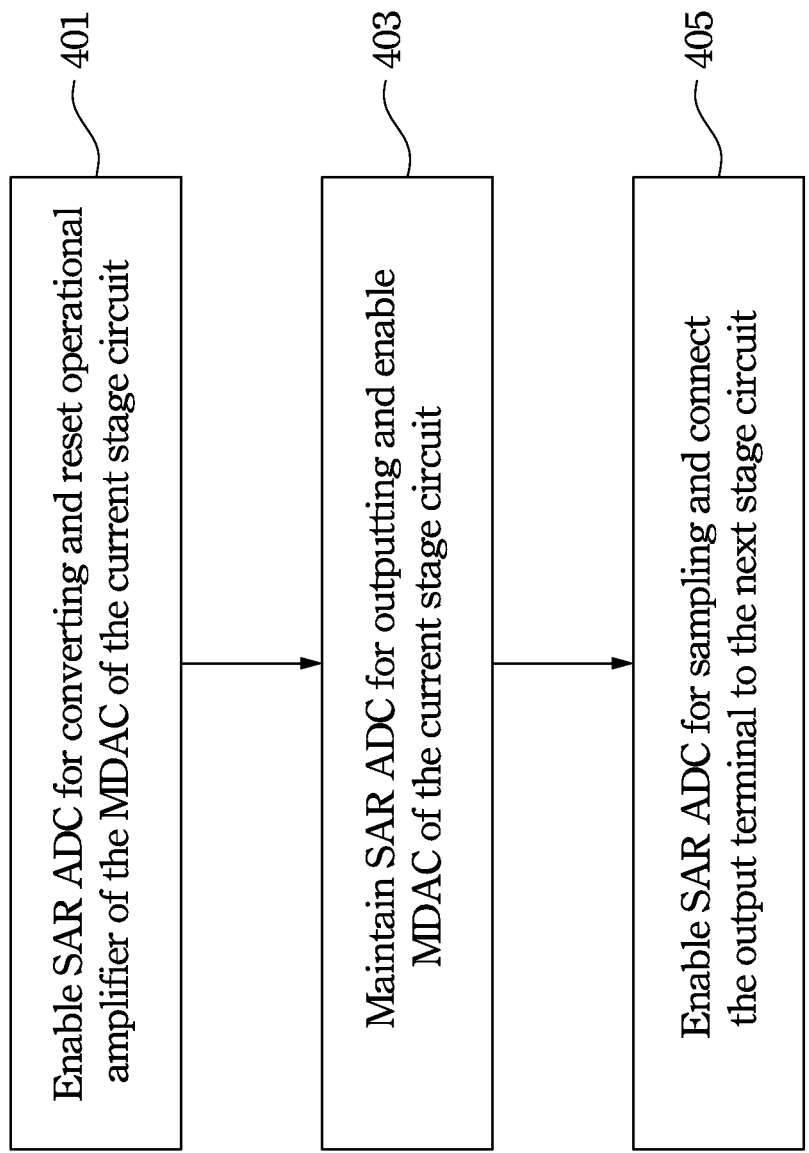

SAR ASSISTED PIPELINED ADC AND METHOD FOR OPERATING THE SAME

BACKGROUND

1. Field of Invention

The present invention relates to an analog-to-digital converter. More particularly, the present invention relates to a pipelined analog-to-digital converter.

2. Description of Related Art

Electronics systems, such as communication or imaging systems, often require a high-speed, high-resolution analog-to-digital converter (ADC) core that can be operated at a low supply voltage and at low power-consumption levels. A switched-capacitor pipeline ADC architecture is one common implementation of a high-speed, high-resolution ADC core. In general, an ADC usually utilizes switched capacitors for sampling and holding a signal in order to achieve a high sampling rate.

In the conventional pipelined ADC, the input stages include a sample-and-hold (SAH) circuit, typically a switched-capacitor circuit, and an multiplying digital to analog converter (MDAC) block as the first residue stage (or the first stage) of the pipelined ADC. While a pipelined SAR ADC architecture realizes high resolution analog-to-digital conversion, such a SAR ADC architecture requires additional processing time for the SAR ADC, and the operational amplifier thereof becomes more difficult to design.

Therefore, there is a need for a new pipelined ADC which consumes less power and has an improved the timing performance.

SUMMARY

According to one embodiment of the present invention, a method for operating a SAR assisted pipelined ADCs is disclosed, in which the SAR assisted pipelined ADC includes a current stage circuit and a next stage circuit, each of the stage circuits includes a SAR ADC and an MDAC, and each MDAC includes an operational amplifier. The method includes enabling the SAR ADC of the current stage circuit for converting an input analog voltage into a digital code during a first time interval, and resetting the operational amplifier of the MDAC of the current stage circuit during the first time interval. The method also includes maintaining the SAR ADC of the current stage circuits in an enabled state for outputting during a second time interval, and enabling the MDAC in the current stage circuit during the second time interval. An output terminal of the MDAC in the current stage circuit is isolated from an input terminal of the next stage circuit. The method additionally includes enabling the SAR ADC in the current stage circuit for sampling during a third time interval, and connecting the output terminal of the MDAC in the current stage circuit to the input terminal of the next stage circuit during the third time interval. The first time interval, the second time interval, and the third time interval are continuous and do not overlap each other.

According to another embodiment of the present invention, a SAR assisted pipelined ADC is disclosed. The SAR assisted pipelined ADC includes a current stage circuit and a next stage circuit, in which the current stage circuit includes a SAR ADC and an MDAC. The SAR ADC digitally converts an input analog voltage during a first time interval. The MDAC is electrically connected to the SAR ADC of the current stage circuit and the next stage circuit for generating a residual voltage according to the input analog voltage during a second time interval. A path for transmitting the residual voltage to the next stage circuit is disconnected during the second time interval and is connected to the SAR ADC of the next stage circuit for sampling the residual voltage during the third time interval.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 4 shows a flowchart of a method for operating a SAR assisted pipelined ADC according to one embodiment of the present invention.

DETAILED DESCRIPTION

Figure 1:
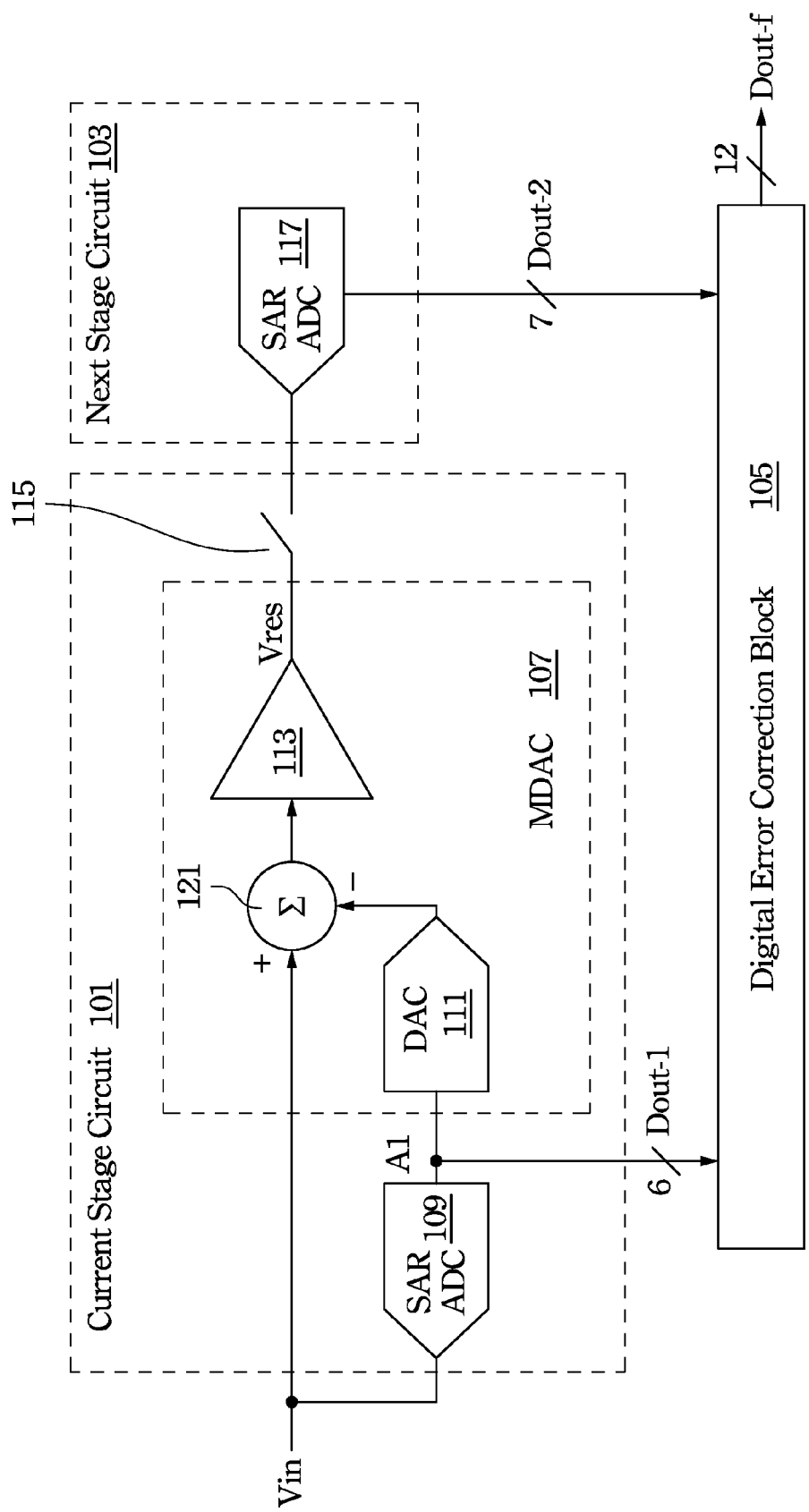
FIG. 1 shows a circuit block diagram of a SAR assisted pipelined ADC according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

In a successive-approximation register (SAR) assisted pipelined analog-to-digital converter (ADC) and a method for operating the same according to embodiments of the present invention, an operational amplifier and a SAR ADC operate during the same time interval such that amplifying and sampling are likewise executed in the same time interval. As a result, the total processing time of the entire SAR assisted pipelined ADC can be reduced, which improves the timing performance thereof.

FIG. 1 shows a circuit block diagram of the SAR assisted pipelined ADC according to one embodiment of the present invention. The SAR assisted pipelined ADC includes a current stage circuit 101, a next stage circuit 103, and a digital error correction block 105. An output terminal of the operational amplifier 113 is disconnected from the next stage circuit 103 through an output switch 115.

The current stage circuit 101 includes a SAR ADC 109 and a multiplying digital-to-analog converter (MDAC) 107. The SAR ADC 109 digitally converts an input analog voltage Vin during a first time interval. The SAR ADC 109 is an analog-to-digital converter that converts a continuous analog signal into a discrete digital signal via a binary search through all possible quantization levels before finally converging upon a digital output for each conversion.

The MDAC 107 is electrically connected to the SAR ADC 109 and the next stage circuit 103. The MDAC 107 generates a residual voltage Vres according to the input analog voltage Vin during a second time interval. A path 115 that transmits the residual voltage Vres to the next stage circuit 103 is disconnected during the second time interval. On the other hand, the path 115 is connected to the SAR ADC 117 of the next stage circuit 103 for sampling the residual voltage during a third time interval.

The MDAC 107 is implemented with a switched-capacitor circuit in some embodiments. The MDAC 107 includes a digital-to-analog converter DAC 111, a mixer 121, and an operational amplifier 113. The MDAC 107 can perform 1.5 bits of conversion in each stage (i.e., 1.5-bits/stage). When the MDAC 107 enters into a sample phase, the operational amplifier 113 has a unity gain configuration. Subsequently, when the MDAC 107 enters into an amplify phase, the amplified residual signal Vres is generated by the operational amplifier 113.

The digital error correction block 105 is used to correct and integrate the converted bits Dout-1 or Dout-2 coming from the current stage circuit 101 or the next stage circuit 103, and subsequently outputs a complete N-bit code $D_{out-f}$, where N is the ADC resolution.

Figure 2A:
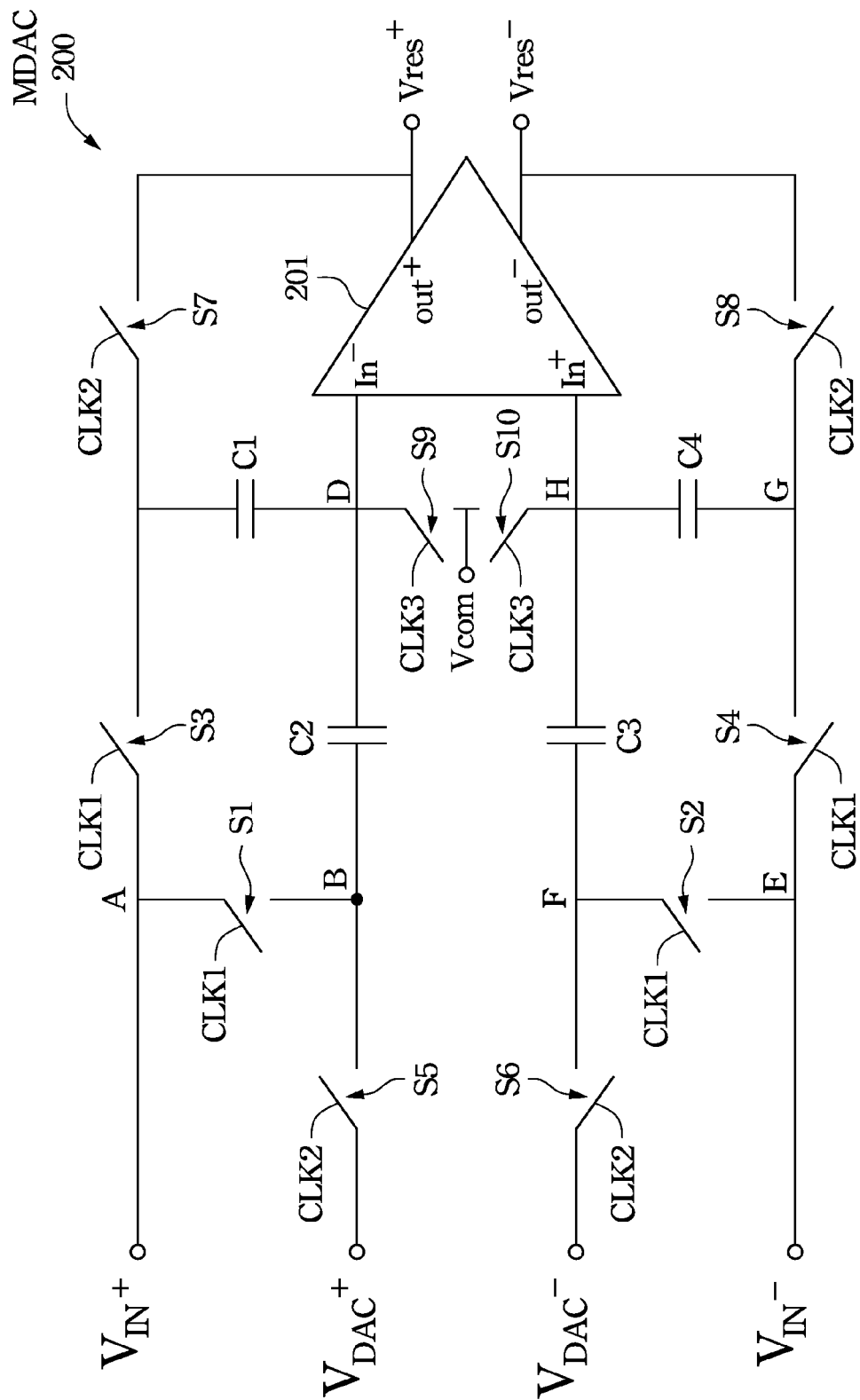
FIG. 2A shows a circuit diagram of an MDAC according to one embodiment of the present invention.

FIG. 2A shows a circuit diagram of the MDAC according to one embodiment of the present invention. The MDAC 200 includes an operational amplifier 201, several switches, and several capacitors.

The operational amplifier 201 has a negative input terminal In−, a positive input terminal In+, a negative output terminal out−, and a positive output terminal out+. The output terminals out+, out−of the operational amplifier 201 are disconnected from the next stage circuit 103 (see FIG. 1) through an output switch.

A first capacitor C1 and a second capacitor C2 have first ends D connected to the negative input terminal In− of the operational amplifier 201. The third capacitor C3 and the fourth capacitor C4 have first ends H connected to the positive input terminal In+ of the operational amplifier 201. A first switch S1 and a third switch S3 have first ends A connected together and have second ends B, C respectively connected to second ends of the second capacitor C2 and the first capacitor C1. A second switch S2 and a fourth switch S4 have first ends E connected together and have second ends F, G respectively connected to second ends of the third capacitor C3 and the fourth capacitor C4.

A seventh switch S7 is connected between the second end C of the first capacitor C1 and the positive output terminal out+ of the operational amplifier 201. An eighth switch S8 is connected between the second end G of the fourth capacitor C4 and the negative output terminal out− of the operational amplifier 201.

A ninth switch S9 and a tenth switch S10 have first ends selectively connected to a common voltage terminal Vcom and have second ends respectively connected to the negative input terminal In− and the positive input terminal In+ of the operational amplifier 201.

The first switch S1, the second switch S2, the third switch S3, and the fourth switch S4 are controlled by a first clock signal CLK1; the seventh switch S7 and the eighth switch S8 are controlled by a second clock signal CLK2; and the ninth switch S9 as well as the tenth switch S10 are controlled by a third clock signal CLK3.

Input signals $V_{IN+}$ and $V_{In-}$ are the differential signals, the signals $V_{DAC+}$ and $V_{DAC-}$ are also the differential signals, and the signals $V_{res+}$ and $V_{res-}$ are the differential signals, too. The MDAC 200 is a differential switched capacitor voltage doubler implemented by using a differential operational amplifier. In detail, the switches S1 to S10 are implemented with transmission gates controlled by the clock signals CLK1, CLK2, and CLK3 respectively.

Figure 2B:
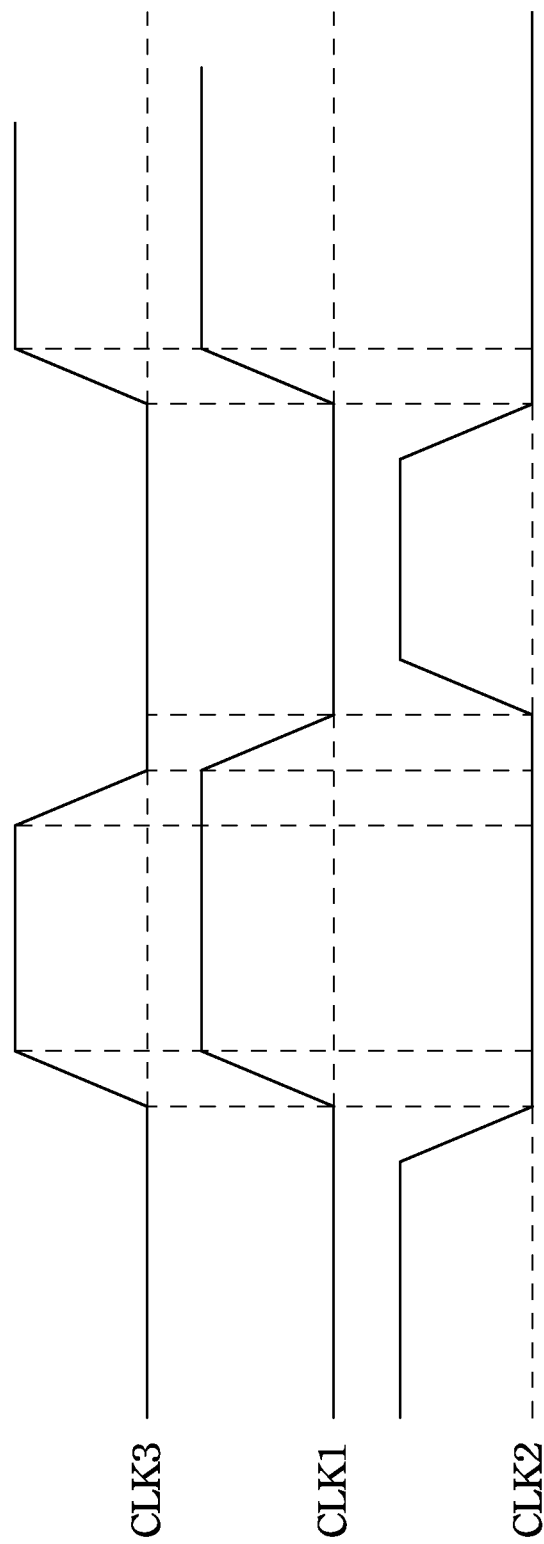
FIG. 2B shows a waveform diagram of clock signals according to one embodiment of the present invention.

FIG. 2B shows a waveform diagram of the clock signals according to one embodiment of the present invention. The clock signals CLK1, CLK2, CLK3 are generated by a clock generator (not shown), in which the clock signal CLK1 is the inverse of the clock signal CLK2 with a small phase shift, and the clock signal CLK3 is an early-falling form of the clock signal CLK1. When the clock signal CLK1 is pulled up, the input signal $V_{IN-}$ is sampled through the capacitors C2, C3, and during this period the operational amplifier 201 is inactive. When the clock signal CLK2 is pulled up, the reference signal $V_{DAC+}$ is coupled to the capacitors C1, C2, C3, C4, in which the electrical charge of the capacitors C2, C3 is equal to the difference of the input signals $V_{IN+}$, $V_{IN-}$ and the reference signals $V_{DAC+}$, $V_{DAC-}$. The electrical charge is subsequently passed to the operational amplifier 201 and a related output signal $V_{res+}$, $V_{res-}$ is generated accordingly.

Figure 3:
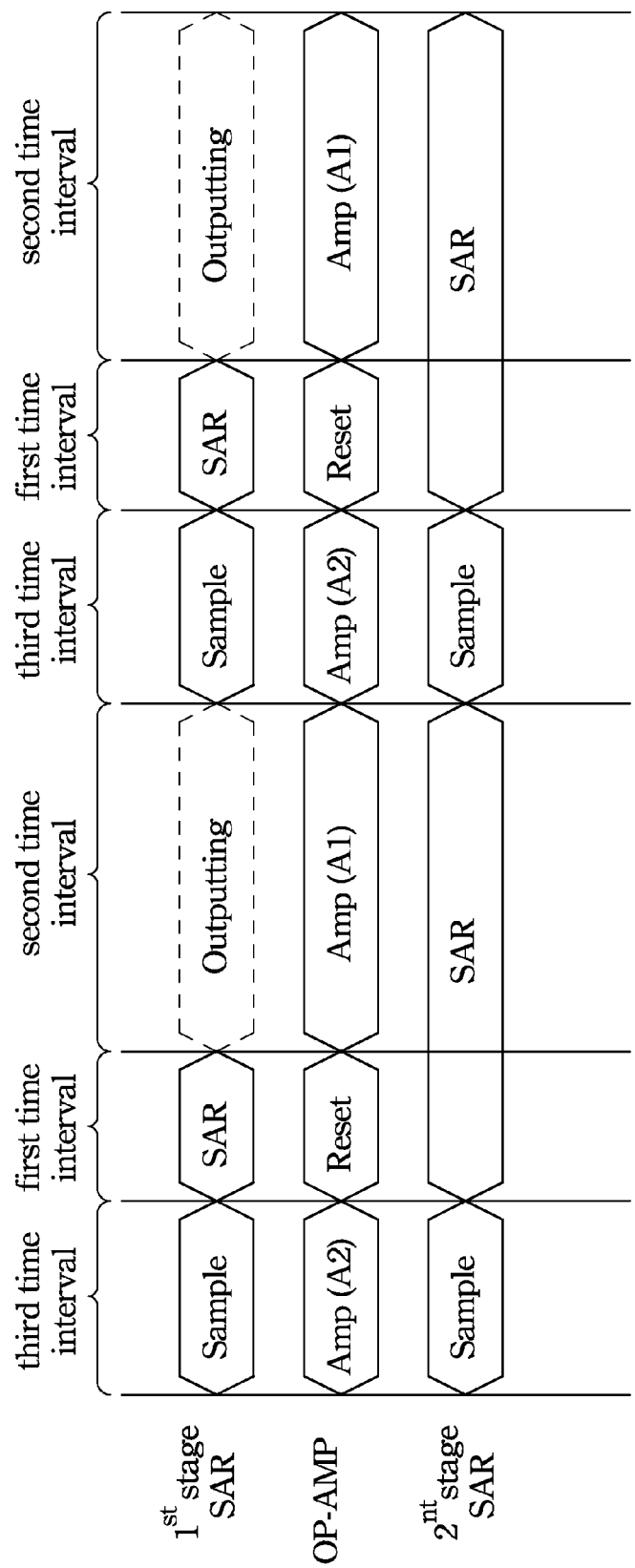
FIG. 3 shows a timing diagram of a SAR assisted pipelined ADC according to one embodiment of present invention.

FIG. 3 shows timing diagram of a SAR assisted pipelined ADC according to one embodiment of present invention. The time length is divided into three time intervals, i.e., the first time interval, the second time interval, and the third time interval. The upper two waveforms show the operation stage of the first stage circuit while the bottom waveform shows the operation stage of second stage circuit.

There are three time intervals (or stages) for a SAR ADC to process a signal, that is, a sampling stage, a decoding (SAR) stage, and an outputting stage. In more detail, the SAR ADC converts, outputs, and samples signals at different time intervals. Furthermore, an operational amplifier can take two time intervals for amplifying signals, which relaxes the timing requirement of the operational amplifier.

FIG. 4 shows a flowchart of a method for operating a SAR assisted pipelined ADC according to one embodiment of the present invention. As stated above, the SAR assisted pipelined ADC usually includes a current stage circuit and a next stage circuit, each of the stage circuits includes a SAR ADC and a MDAC, and each MDAC contains an operational amplifier.

In the beginning, the SAR ADC in the current stage circuit is enabled for converting an input analog voltage into a digital code during a first time interval, and the operational amplifier of the MDAC of the current stage circuit is reset during the first time interval (step 401).

Next, the SAR ADC of the current stage circuit is maintained in its present (enabled) state for outputting a signal during a second time interval, and the MDAC of the current stage circuit is enabled during the second time interval (step 403). During the second time interval, an output terminal of the MDAC of the current stage circuit is isolated from an input terminal of the next stage circuit.

Subsequently, the SAR ADC in the current stage circuit is enabled for sampling during a third time interval, and the output terminal of the MDAC of the current stage circuit is connected to the input terminal of the next stage circuit during the third time interval (step 405). It is noted that the first time interval, the second time interval, and the third time interval are continuous and do not overlap each other.

In addition to the operations stated above, the SAR ADC of the next stage circuit is enabled for performing conversion during the first time interval as well as the second time interval, and the SAR ADC of the next stage circuit is enabled for sampling during the third time interval.

With such a timing arrangement, the SAR ADC and the operational amplifier can process signals during the same time interval, that is, the SAR ADC can sample or output signals while the operational amplifier amplifies signals, which improves the timing performance of the SAR assisted pipelined ADC. In addition, loading of the operational amplifier is relaxed in an amplify phase, and an idle time of the operational amplifier is reduced such that the SAR ADC has a longer period for performing conversion.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for operating a SAR assisted pipelined ADC, wherein the SAR assisted pipelined ADC comprises a current stage circuit and a next stage circuit, each of the stage circuits comprises a SAR ADC and an MDAC, and each MDAC comprises an operational amplifier, the method comprising:
   enabling the SAR ADC in the current stage circuit for converting an input analog voltage into a digital code during a first time interval;
   resetting the operational amplifier of the MDAC of the current stage circuit during the first time interval;
   maintaining the SAR ADC of the current stage circuit in an enabled state for outputting during a second time interval;
   enabling the MDAC of the current stage circuit during the second time interval, wherein an output terminal of the MDAC of the current stage circuit is isolated from an input terminal of the next stage circuit;
   enabling the SAR ADC of the current stage circuit for sampling during a third time interval; and
   connecting the output terminal of the MDAC of the current stage circuit to the input terminal of the next stage circuit during the third time interval,
   wherein the first time interval, the second time interval, and the third time interval are continuous and do not overlap each other.

2. The method for operating the SAR assisted pipelined ADC as claimed in claim 1, further comprising:
   enabling the SAR ADC of the next stage circuit for performing conversion during the first time interval and during the second time interval; and
   enabling the SAR ADC of the next stage circuit for sampling during the third time interval.

3. A SAR assisted pipelined ADC, comprising a current stage circuit and a next stage circuit, the current stage circuit comprising:
   a SAR ADC for digitally converting an input analog voltage during a first time interval; and
   an MDAC electrically connected to the SAR ADC and the next stage circuit for generating a residual voltage according to the input analog voltage during a second time interval, the MDAC comprising:
       a first switch and a third switch having first ends connected together and having second ends respectively connected to second ends of the second capacitor and the first capacitor;
       a second switch and a fourth switch having first ends connected together and having second ends respectively connected to second ends of the third capacitor and the fourth capacitor;
       a seventh switch connected between the second end of the first capacitor and the positive output terminal of the operational amplifier;
       a eighth switch connected between the second end of the fourth capacitor and the negative output terminal of the operational amplifier; and
       a ninth switch and a tenth switch having first ends selectively connected to a common voltage terminal and having second ends respectively connected to the negative input terminal and the positive input terminal of the operational amplifier,
   wherein the first switch, the second switch, the third switch and the fourth switch are controlled by a first clock signal, the seventh switch and the eighth switch are controlled by a second clock signal, and the ninth switch and the tenth switch are controlled by a third clock signal,
   wherein a path for transmitting the residual voltage to the next stage circuit is disconnected during the second time interval and is connected to the SAR ADC of the next stage circuit for sampling the residual voltage during a third time interval.

4. The SAR assisted pipelined ADC as claimed in claim 3, wherein the MDAC further comprises:
   an operational amplifier having a negative input terminal, a positive input terminal, a negative output terminal, and a positive output terminal;
   a first capacitor and a second capacitor having first ends connected to the negative input terminal of the operational amplifier; and
   a third capacitor and a fourth capacitor having first ends connected to the positive input terminal of the operational amplifier.

5. The SAR assisted pipelined ADC as claimed in claim 4, wherein an output terminal of the operational amplifier is disconnected from the next stage circuit through an output switch.

* * * * *